United States Patent
Yoshida

(10) Patent No.: US 12,108,520 B2
(45) Date of Patent: Oct. 1, 2024

(54) CIRCUIT BOARD AND CIRCUIT MODULE

(71) Applicant: SHINKO ELECTRIC INDUSTRIES CO., LTD., Nagano (JP)

(72) Inventor: Kazuhiro Yoshida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 228 days.

(21) Appl. No.: 17/811,947

(22) Filed: Jul. 12, 2022

(65) Prior Publication Data

US 2023/0031168 A1 Feb. 2, 2023

(30) Foreign Application Priority Data

Jul. 28, 2021 (JP) .................................. 2021-123546

(51) Int. Cl.
*H05K 1/00* (2006.01)
*H05K 1/02* (2006.01)
*H05K 1/18* (2006.01)

(52) U.S. Cl.
CPC ........... *H05K 1/0216* (2013.01); *H05K 1/181* (2013.01); *H05K 1/184* (2013.01); *H05K 1/189* (2013.01)

(58) Field of Classification Search
CPC ...... H05K 1/0216; H05K 1/181; H05K 1/184; H05K 1/189
See application file for complete search history.

(56) References Cited

U.S. PATENT DOCUMENTS

2006/0263013 A1* 11/2006 Sone ..................... G02B 6/4281
  257/E31.112
2018/0166203 A1* 6/2018 Chin ........................ H01F 41/02
2023/0345618 A1* 10/2023 Lee ........................... H05K 1/18

FOREIGN PATENT DOCUMENTS

JP 2016-090295 5/2016

* cited by examiner

*Primary Examiner* — Pete T Lee
(74) *Attorney, Agent, or Firm* — IPUSA, PLLC

(57) ABSTRACT

A circuit board includes a magnetic shielding member having a first principal surface, and a second principal surface on an opposite side from the first principal surface, and a flexible wiring board having a first surface, and a second surface on an opposite side from the first surface. The second surface of the flexible wiring board is fixed to the first principal surface and the second principal surface of the magnetic shielding member. The first surface of the flexible wiring board includes a circuit area mounted with an electronic component, and one or more terminal areas where connection terminals are disposed. The circuit area is disposed above the first principal surface of the magnetic shielding member. The circuit board has a bent shape bent along the magnetic shielding member, so that the one or more terminal areas are disposed below the second principal surface of the magnetic shielding member.

10 Claims, 11 Drawing Sheets

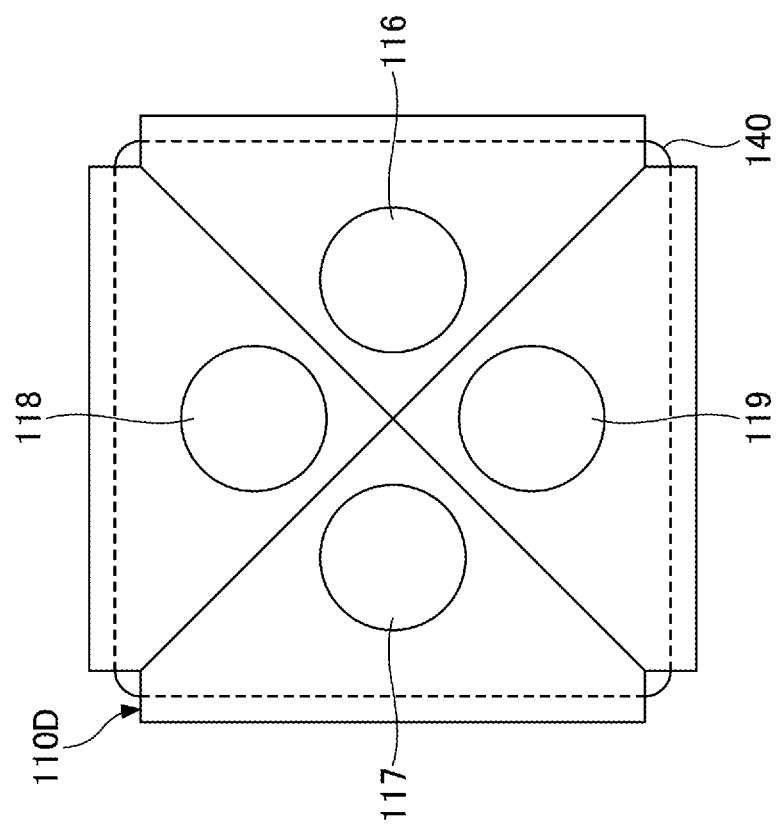

CIRCUIT BOARD AND CIRCUIT MODULE

CROSS-REFERENCE TO RELATED APPLICATIONS

This application is based upon and claims priority to Japanese Patent Application No. 2021-123546, filed on Jul. 28, 2021, the entire contents of which are incorporated herein by reference.

FIELD

Certain aspects of the embodiments discussed herein are related to circuit boards and circuit modules.

BACKGROUND

Various circuit modules, such as measuring devices, are known. For example, an example of the measuring device includes a casing accommodating a circuit board having electronic components mounted thereon, and a magnet. This measuring device includes a magnetic shielding member that prevents a magnetic field of the magnet from affecting the electronic components, as proposed in Japanese Laid-Open Patent Publication No. 2016-90295, for example.

However, a material used for the magnetic shielding member of the circuit board is generally more difficult to process compared to resin materials, thereby making it difficult to form an interlayer connection structure such as a through hole, a via, or the like. On the other hand, if the electronic components and connection terminals were concentrated only on one surface of the circuit board without forming the interlayer connection structure on the magnetic shielding member, constraints on a degree of freedom of layout design would become severe.

SUMMARY

The present invention has been made in view of the above described points, and it is an object to provide a circuit board with an improved degree of freedom of layout design without forming an interlayer connection structure on the magnetic shielding member.

According to one aspect of the embodiments, a circuit board includes a magnetic shielding member having a first principal surface, and a second principal surface on an opposite side from the first principal surface; and a flexible wiring board having a first surface, and a second surface on an opposite side from the first surface, wherein the second surface of the flexible wiring board is fixed to the first principal surface and the second principal surface of the magnetic shielding member, the first surface of the flexible wiring board includes a circuit area mounted with an electronic component, and one or more terminal areas where connection terminals are disposed, the circuit area is disposed above the first principal surface of the magnetic shielding member, and the circuit board has a bent shape bent along the magnetic shielding member, so that the one or more terminal areas are disposed below the second principal surface of the magnetic shielding member.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 11 is a bottom view illustrating an example of the state where the wiring board according to the second modification of the second embodiment is bent.

DESCRIPTION OF EMBODIMENTS

Figure 1:
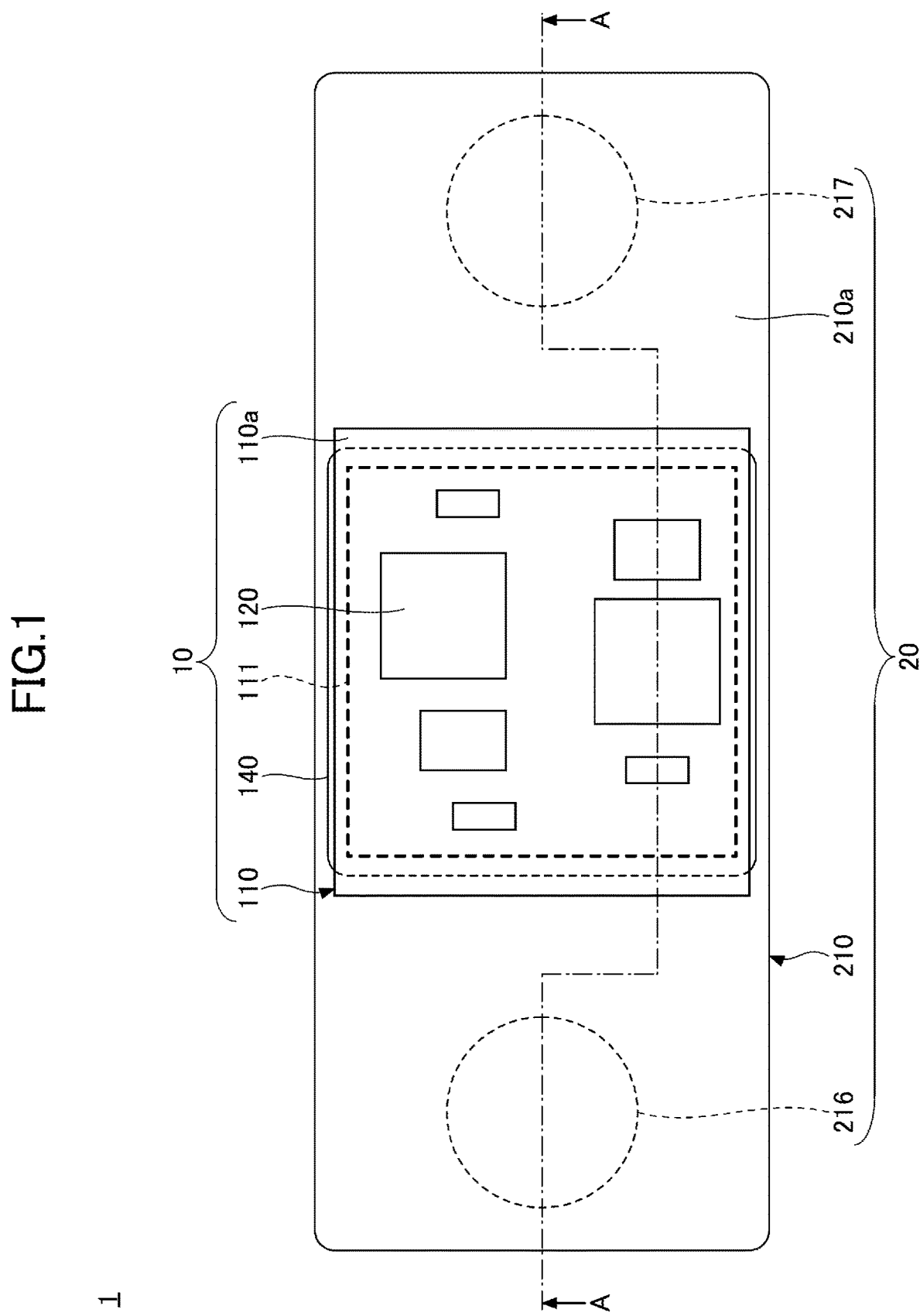
FIG. 1 is a plan view illustrating an example of a circuit module according to a first embodiment.

Preferred embodiments of the present invention will be described with reference to the accompanying drawings. In the drawings, those parts that are the same are designated by the same reference numerals, and a repeated description of the same parts may be omitted.

A description will now be given of embodiments and modifications of a circuit board and a circuit module according to the present invention.

First Embodiment

Figure 2:
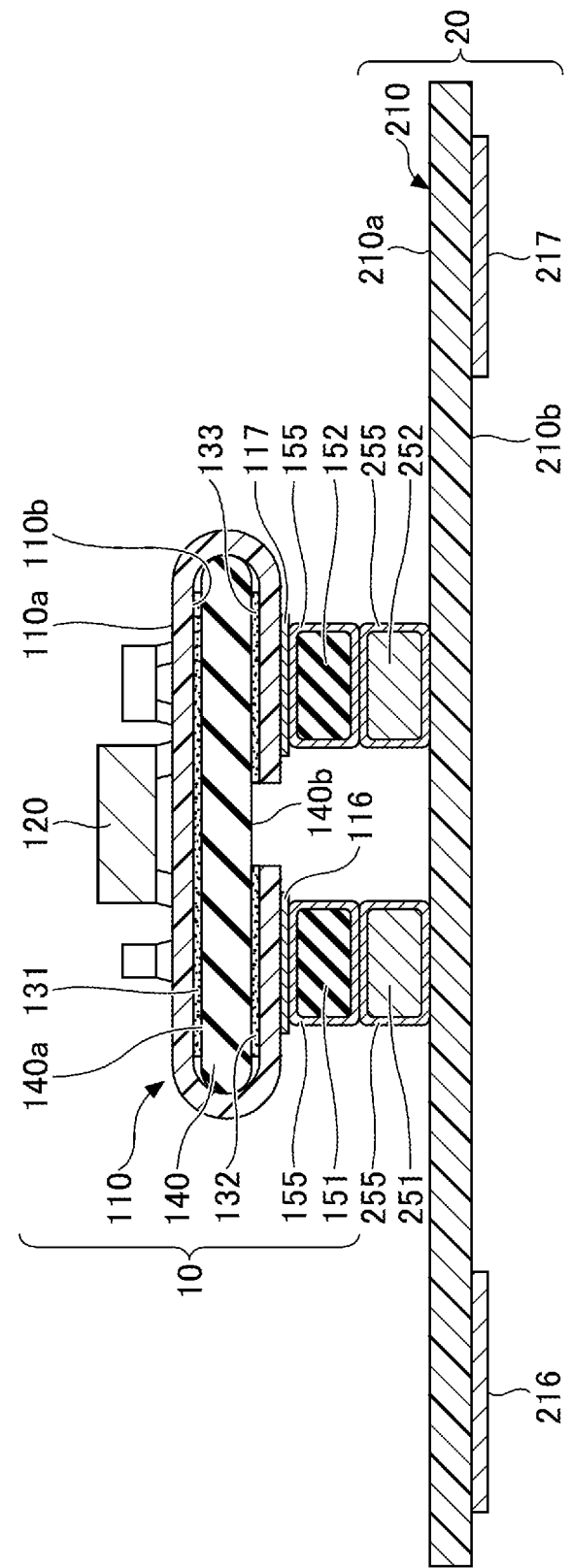
FIG. 2 is a cross sectional view along a line A-A in FIG. 1.

FIG. 1 is a plan view illustrating an example of the circuit module according to a first embodiment. FIG. 2 is a cross sectional view along a line A-A of FIG. 1. As illustrated in FIG. 1 and FIG. 2, a circuit module 1 includes a circuit board 10, and a board 20 that is provided with electrodes.

[Circuit Board 10]

Figure 3:
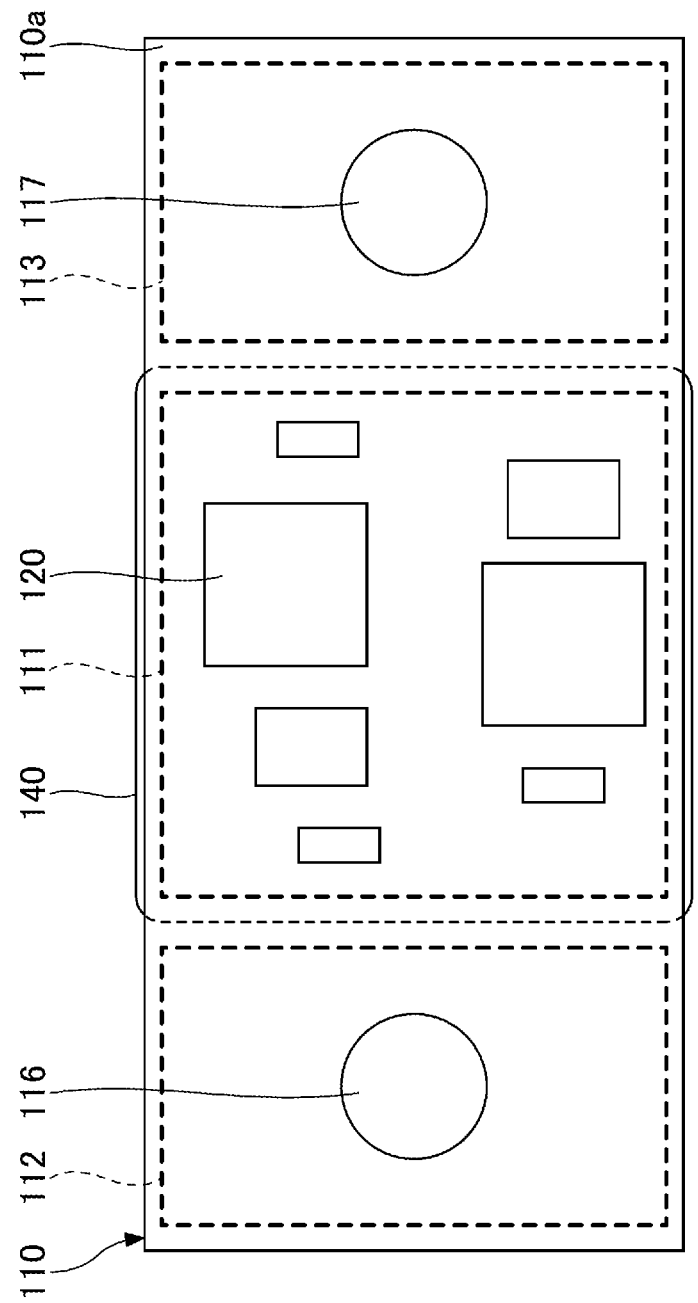
FIG. 3 is a plan view illustrating an example of a state where a wiring board according to the first embodiment is not bent.

FIG. 3 is a plan view illustrating an example of a state where a wiring board according to the first embodiment is not bent. As illustrated in FIG. 1 through FIG. 3, the circuit board 10 includes a wiring board 110, electronic components 120, bonding layers 131 through 133, a magnetic shielding member 140, and magnets 151 and 152. However, the circuit board 10 may be configured to include no magnets 151 and 152, and attachable with the magnets 151 and 152 when required.

The wiring board 110 is a flexible board or board. The wiring board 110 includes interconnect patterns, pads used for mounting components, an insulating layer, or the like that are provided on an insulating resin having a low Young's modulus and flexibility, for example. Examples of the insulating resin having the low Young's modulus and flexibility include polyimide-based resins, epoxy-based resins, urethane-based resins, liquid crystal polymers, or the like, for example. The wiring board 110 has a rectangular planar shape, for example, but the planar shape of the wiring board 110 is not particularly limited. The wiring board 110 may have a thickness in a range of approximately 20 μm to approximately 100 μm, for example.

As illustrated in FIG. 3, a first surface 110a of the wiring board 110 includes a circuit area 111, and terminal areas 112 and 113. In a state before the wiring board 110 is bent, the circuit area 111 is located approximately at a center of the first surface 110a along a longitudinal direction of the first surface 110a. In addition, the terminal areas 112 and 113 are provided on respective outer sides of the circuit area 111 of the first surface 110a along the longitudinal direction of the first surface 110a. FIG. 3 is a development view corresponding to the state before the wiring board 110 is bent. Similarly, FIG. 5, FIG. 7, FIG. 8, and FIG. 10 that will be described later are development views corresponding to the state before the respective wiring boards are bent.

A plurality of electronic components 120 is mounted in the circuit area 111. The electronic components 120 may include semiconductor components and passive components. The electronic components 120 may include a circuit that processes biometric signals, for example. Examples of the semiconductor components forming the electronic components 120 include integrated circuits or the like that perform signal processing, for example. Examples of the passive components forming the electronic component 120 include resistors, capacitors, inductors, antennas, connectors, or the like, for example. A second surface 110b of the wiring board 110, on an opposite side from the first surface 110a, is not mounted with an electronic component or the like.

A connection terminal 116 is disposed in the terminal area 112, and a connection terminal 117 is disposed in the terminal area 113. The connection terminals 116 and 117 have a planar shape that is circular, for example, but the planar shape may be rectangular or the like. The connection terminals 116 and 117 are electrically connected to associated portions of the electronic components 120 via interconnects that are not illustrated. Examples of a material for the connection terminals 116 and 117 include copper or the like, for example. The connection terminals 116 and 117 may have a thickness in a range of approximately 5 μm to approximately 35 μm, for example.

As illustrated in FIG. 2, the second surface 110b of the wiring board 110, having the plurality of electronic components 120 mounted on the first surface 110a, is fixed to the magnetic shielding member 140 via bonding layers 131 through 133. The magnetic shielding member 140 has a first principal surface 140a, and a second principal surface 140b on the opposite side from the first principal surface 140a. In the plan view, the magnetic shielding member 140 is preferably larger than the circuit area 111. Examples of a material used for the magnetic shielding member 140 include permalloy, silicon steel, or the like, for example. The magnetic shielding member 140 may have a thickness in a range of approximately 0.1 mm to approximately 2 mm, for example. The magnetic shielding member 140 may be flexible. In addition, examples of a material used for the bonding layers 131 through 133 include acrylic-based resins, epoxy-based resins, or the like, for example. Examples of a state of supply of the bonding layers 131 through 133 include a liquid state, a film state, or the like, for example.

Each of the bonding layers 131 through 133 may have a thickness in a range of approximately 20 μm to approximately 100 μm, for example.

More particularly, in the second surface 110b of the wiring board 110, an area overlapping the circuit area 111 in the plan view is fixed to the first principal surface 140a of the magnetic shielding member 140 via the bonding layer 131. That is, the circuit area 111 of the wiring board 110 is disposed above the first principal surface 140a of the magnetic shielding member 140.

In addition, the wiring board 110 has a bent shape such that both ends of the wiring board 110 are bent along respective edges of the magnetic shielding member 140, in an area between the circuit area 111 and the terminal area 112, and in an area between the circuit area 111 and the terminal area 113. In the second surface 110b of the wiring board 110, an area overlapping the terminal area 112 in the plan view is fixed to the second principal surface 140b of the magnetic shielding member 140 via the bonding layer 132.

Moreover, in the second surface 110b of the wiring board 110, an area overlapping the terminal area 113 in the plan view is fixed to the second principal surface 140b of the magnetic shielding member 140 via the bonding layer 133. That is, the terminal areas 112 and 113 of the wiring board 110 are disposed below the second principal surface 140b of the magnetic shielding member 140. Accordingly, the circuit area 111 and the terminal areas 112 and 113 are disposed on opposite sides of the magnetic shielding member 140 in the cross sectional view.

A magnet 151 may be bonded to the connection terminal 116 by a solder or the like, for example. Similarly, a magnet 152 may be bonded to the connection terminal 117 by a solder or the like, for example. A metal layer 155 is preferably famed on respective surfaces of the magnets 151 and 152. That is, the magnets 151 and 152 are preferably covered with the metal layer 155, in order to improve a connection reliability (or interface reliability) between the terminals 116 and 117 and the magnets 151 and 152, respectively, and to reduce electrical resistances. Examples of a material used for the magnets 151 and 152 include ferrite, cobalt, neodymium, or the like, for example. Examples of a material used for the metal layer 155 include copper, gold, or the like, for example. The metal layer 155 can be formed by electroless plating, for example.

The second surface 110b of the wiring board 110 at a portion corresponding to the connection terminals 116 and 117 at least bonded with the magnets 151 and 152 in the plan view, is rigidly bonded to the magnetic shielding member 140 using an bonding layer.

[Board 20 Provided with Electrodes]

The board 20 provided with electrodes includes a wiring board 210 having a third surface 210a, and a fourth surface 211b on an opposite side from the third surface 210a. Ferromagnetic metal portions 251 and 252 are provided on the third surface 210a, and external electrodes 216 and 217 that are respectively electrically connected to the ferromagnetic metal portions 251 and 252 are provided on the fourth surface 210b. The wiring board 210 is a flexible or stretchable. The wiring board 210 includes interconnect patterns, pads used for mounting the components, an insulating layer, or the like that are provided on an insulating resin. Examples of the insulating resin include polyimide-based resins, epoxy-based resins, liquid crystal polymers, or the like, for example, similar to the wiring board 110. A material, such as urethane or the like, having an excellent stretchability may be used for the wiring board 210. The wiring board 210 may have a thickness in a range of approximately 20 μm to approximately 100 μm, for example.

Pads (not illustrated) are formed on the third surface 210a of the wiring board 210, in areas overlapping the connection terminals 116 and 117 in a plan view, and the ferromagnetic metal portions 251 and 252 are bonded to the respective pads (not illustrated) by a solder or the like, for example. The ferromagnetic metal portions 251 and 252 form protruding electrodes. The ferromagnetic metal portions 251 and 252 are detachably connectable to the respective magnets 151 and 152 by magnetic forces of the magnets 151 and 152, and the ferromagnetic metal portions 251 and 252 are electrically connected to the magnets 151 and 152, respectively. Examples of a material used for the ferromagnetic metal portions 251 and 252 include SUS430 or the like, for example. A metal layer 255 is preferably formed on respective surfaces of the ferromagnetic metal portions 251 and 252, in order to improve a connection reliability (or interface reliability) between the ferromagnetic metal portions 251 and 252 and the pads, respectively, and to reduce electrical resistances. Examples of a material used for the metal layer 255 include copper, gold, or the like, for example. The metal layer 255 can be formed by electroless plating, for example.

Magnets may be used in place of the ferromagnetic metal portions 251 and 252, as the protruding electrodes. However, because the magnets have polarities, it becomes necessary to match the polarities of the magnets so that the magnets are detachably connectable by magnetic attraction to the respective magnets 151 and 152. For this reason, it is easier to manufacture the board 20 provided with electrodes using the non-polar ferromagnetic metal portions 251 and 252 as protruding electrodes.

The external electrodes 216 and 217 are provided on the fourth surface 210b of the wiring board 210. The external electrodes 216 and 217 are electrically connected to the respective pads to which the ferromagnetic metal portions 251 and 252 are fixed, via interconnects, through holes, or the like (not illustrated). The external electrodes 216 and 217 are portions that make contact with a measurement target, and to which signals from the measurement target are input. Examples of a material used for the external electrodes 216 and 217 include copper, silver, or the like, for example. The external electrodes 216 and 217 may have a thickness in a range of approximately 5 μm to approximately 35 μm, for example.

The signal input from the external electrode 216 is input to a required portion of the electronic component 120, via the ferromagnetic metal portion 251, the magnet 151, and the connection terminal 116. In addition, the signal input from the external electrode 217 is input to a required portion of the electronic component 120, via the ferromagnetic metal portion 252, the magnet 152, and the connection terminal 117.

Accordingly, the circuit board 10 has the electronic component 120 mounted on the first principal surface 140a of the magnetic shielding member 140, and the connection terminals 116 and 117, respectively connectable to the magnets 151 and 152, disposed on the second principal surface 140b of the magnetic shielding member 140. For this reason, even when magnetic field generating components, such as the magnets 151 and 152, are disposed on the respective connection terminals 116 and 117, magnetic fields of the magnets 151 and 152 or the like are shielded by the magnetic shielding member 140. Hence, it is possible to reduce the effects of noise caused by the magnetic fields of the magnets 151 and 152 or the like on the electronic component 120, and obtain a desired output signal.

In addition, because the material generally used for the magnetic shielding member 140, such as permalloy, silicon steel, or the like, is more difficult to process compared to resin materials or the like, forming an interlayer connection structure, such as through holes, vias, or the like can increase the manufacturing cost. But in the circuit board 10, the electronic components 120 are mounted on only the first surface 110a of the wiring board 110, and the connection terminals 116 and 117 are also disposed only on the first surface 110a of the wiring board 110. For this reason, in the circuit board 10, the electronic components 120 and the connection terminals 116 and 117 can easily be disposed on the opposite side of the magnetic shielding member 140 by simply bending the wiring board 110, thereby eliminating the need to form an interlayer connection structure in the magnetic shielding member 140, and reducing the manufacturing cost. Further, because the electronic components 120, the connection terminal 116, or the like can be disposed on both sides of the magnetic shielding member 140, it is possible to improve a degree of freedom of layout design.

Moreover, the circuit board 10 is detachably connected to the ferromagnetic metal portions 251 and 252 by the magnetic forces of the magnets 151 and 152, it is possible to attach the circuit board 10 to the board 20 provided with electrodes only when required.

The circuit module 1 can be utilized as a sensor that detects various biometric information from a living body, by causing the external electrodes 216 and 217 to make contact with the living body, for example. More particularly, the circuit module 1 can be utilized as a myoelectric sensor, for example. Alternatively, the circuit module 1 may be utilized as an electrocardiographic sensor or a magnetoencephalographic sensor, for example.

First Modification of First Embodiment

A first modification of the first embodiment relates to an example of the circuit module having a wiring board different from the wiring board of the first embodiment. In the first modification of the first embodiment, those constituent elements that are the same as the constituent elements of the first embodiment are designated by the same reference numerals, and a repeated description thereof may be omitted.

Figure 4:
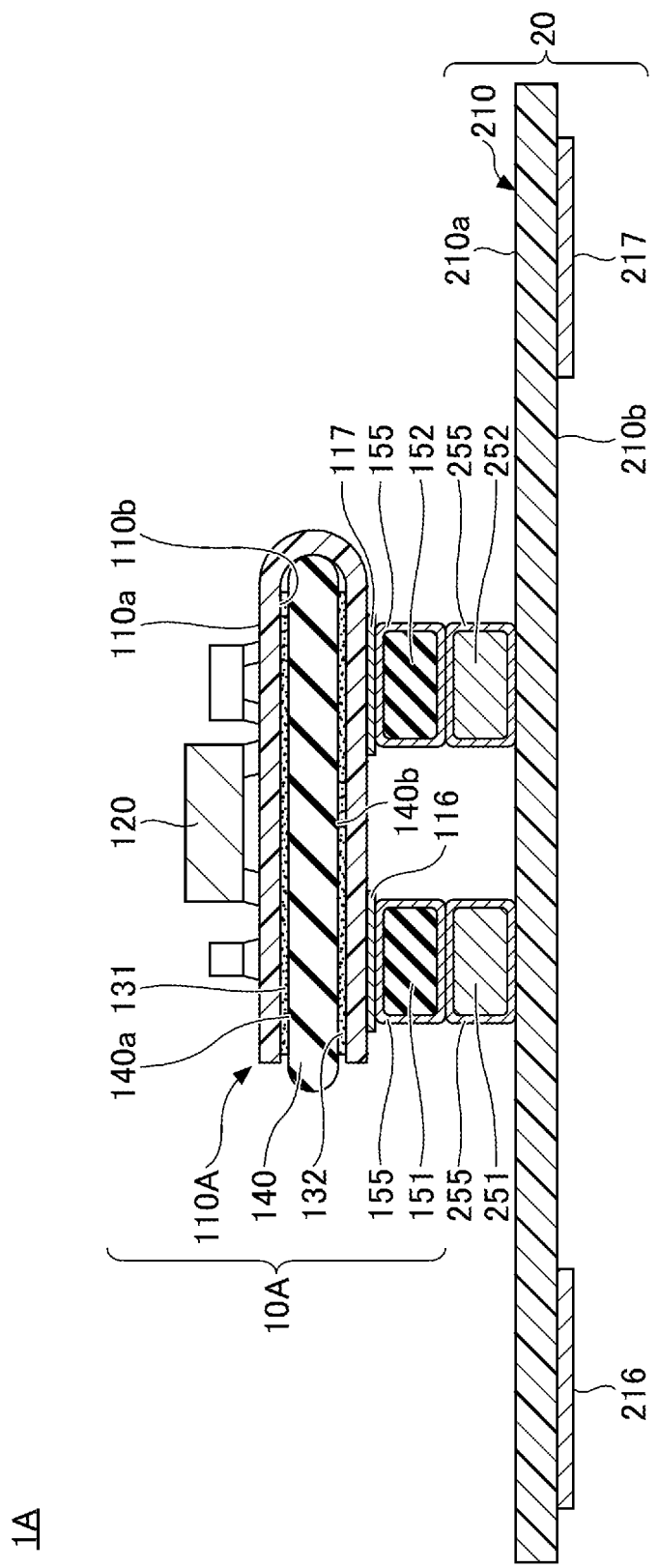
FIG. 4 is a cross sectional view illustrating an example of the circuit module according to a first modification of the first embodiment.
Figure 5:
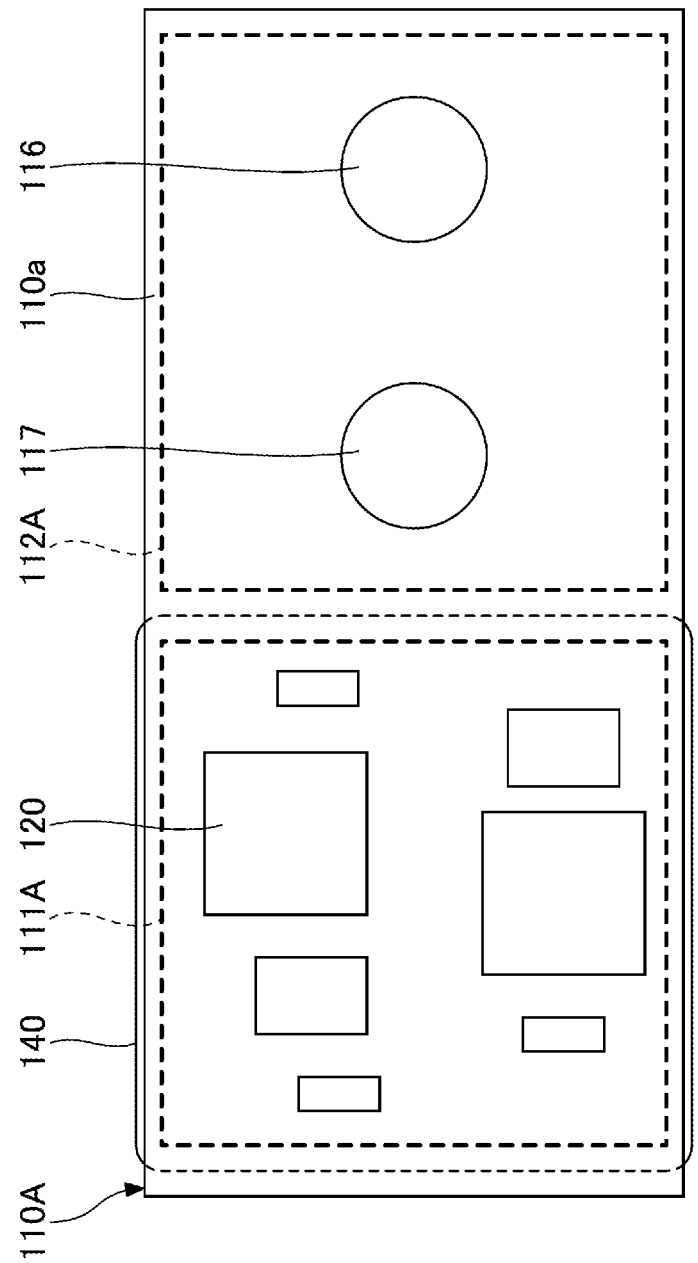
FIG. 5 is a plan view illustrating an example of the state where the wiring board according to the first modification of the first embodiment is not bent.

FIG. 4 is a cross sectional view illustrating an example of the circuit module according to a first modification of the first embodiment, and illustrates a cross section corresponding to FIG. 2. FIG. 5 is a plan view illustrating an example of a state where the circuit board according to the first modification of the first embodiment is not bent. As illustrated in FIG. 4 and FIG. 5, a circuit module 1A differs from circuit module 1 illustrated in FIG. 1 through FIG. 3 in that the circuit board 10 is replaced by a circuit board 10A.

The circuit board 10A includes a wiring board 110A, the electronic components 120, the bonding layers 131 and 132, the magnetic shielding member 140, and the magnets 151 and 152. However, the circuit board 10A may be configured to include no magnets 151 and 152, and attachable with the magnets 151 and 152 when required.

As illustrated in FIG. 5, the first surface 110a of the wiring board 110A includes a circuit area 111A and a terminal area 112A. The circuit area 111A is provided on one side of the first surface 110a along the longitudinal direction of the first surface 110a in a state before the wiring board 110A is bent. The plurality of electronic components 120 is mounted in the circuit area 111A. The second surface 110b of the wiring board 110A is not mounted with an electronic component or the like. In addition, the terminal area 112A is provided adjacent to the circuit area 111A on the other side of the first surface 110a along the longitudinal direction of the first surface 110a. The connection terminals 116 and 117 are disposed in the terminal area 112A.

As illustrated in FIG. 4, the wiring board 110A having the plurality of electronic components 120 mounted thereon is fixed to the magnetic shielding member 140 via the bonding layers 131 and 132. More particularly, in the second surface 110b of the wiring board 110A, an area overlapping the circuit area 111A in the plan view is fixed to the first principal surface 140a of the magnetic shielding member 140 via the bonding layer 131. That is, the circuit area 111A of the wiring board 110A is disposed above the first principal surface 140a of magnetic shielding member 140.

In addition, the wiring board 110A has a bent shape such that the other side of the wiring board 110A is bent along the end of the magnetic shielding member 140 in an area between the circuit area 111A and the terminal area 112A. In the second surface 110b of the wiring board 110A, an area overlapping the terminal area 112A in the plan view is fixed to the second principal surface 140b of the magnetic shielding member 140 via the bonding layer 132. That is, the terminal area 112A of the wiring board 110A is disposed below the second principal surface 140b of the magnetic shielding member 140. Accordingly, the circuit area 111A and the terminal area 112A are disposed on opposite sides of the magnetic shielding member 140 in the cross sectional view.

Hence, in a state before the wiring board 110A is bent, one terminal area 112A where the connection terminals 116 and 117 are disposed may be provided on one side of the circuit area 111A of the first surface 110a. In this case, the wiring board 110A has a bent shape such that the wiring board 110A is bent the along magnetic shielding member 140 in the area between the circuit area 111A and the terminal area 112A. Thus, the circuit area 111A is disposed above the first principal surface 140a of the magnetic shielding member 140, and the terminal area 112A is disposed below the second principal surface 140b of the magnetic shielding member 140. As a result, it is possible to obtain effects that are the same as the effects obtainable in the first embodiment.

Second Embodiment

A second embodiment relates to an example of the circuit module having three or more external electrodes. In the second embodiment, those constituent elements that are the same as the constituent elements of the first embodiment are designated by the same reference numerals, and a repeated description thereof may be omitted.

Figure 6:
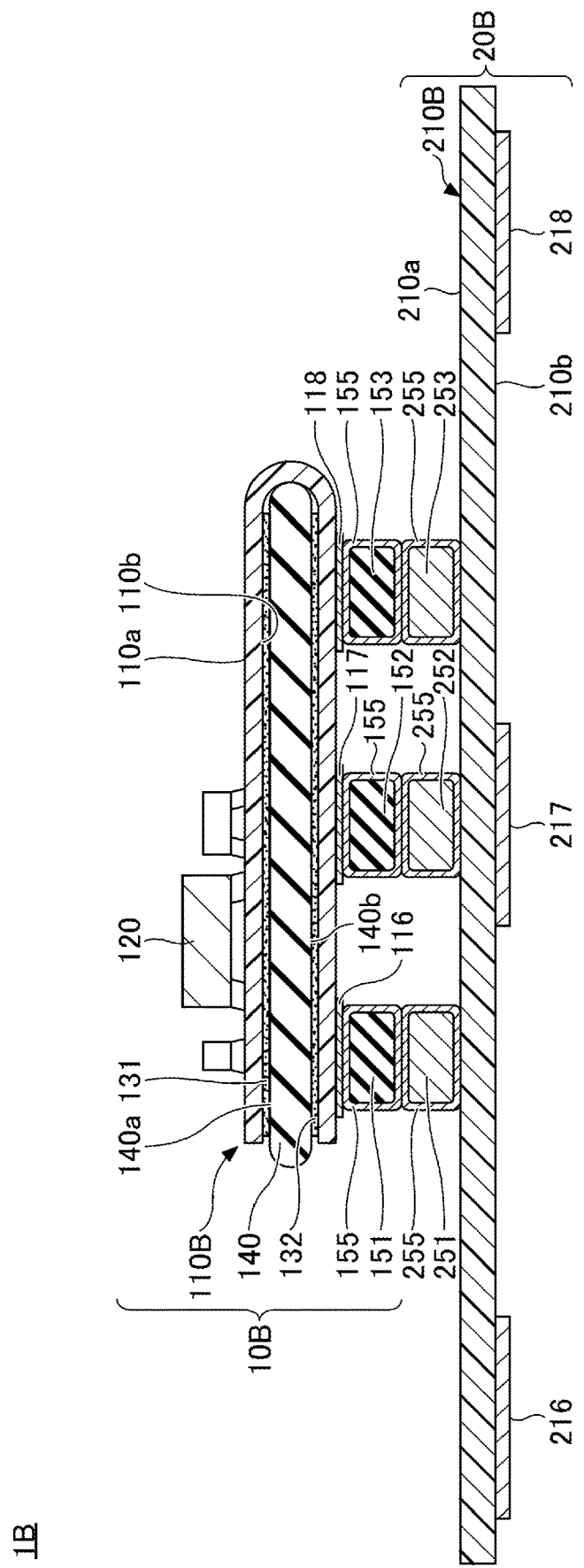
FIG. 6 is a cross sectional view illustrating an example of the circuit module according to a second embodiment.
Figure 7:
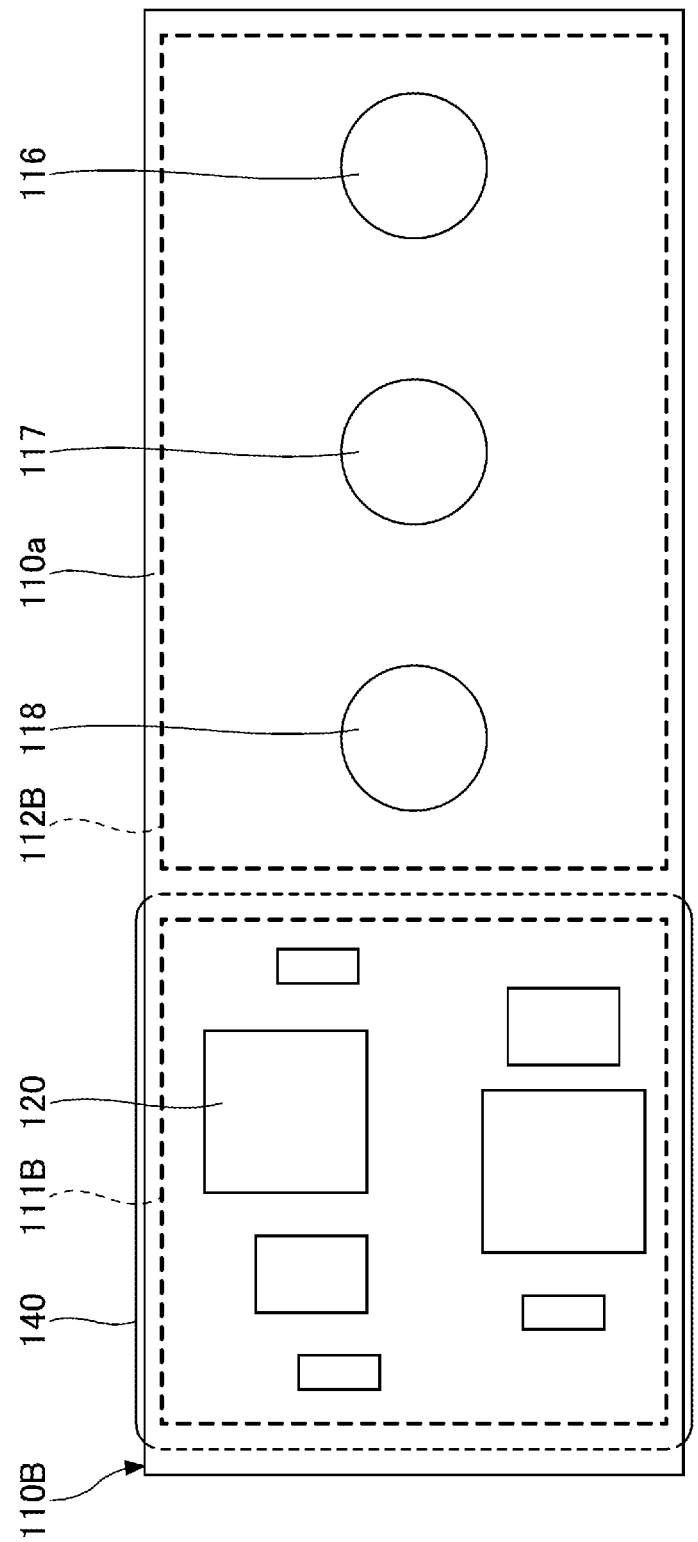
FIG. 7 is a plan view illustrating an example of the state where the wiring board according to the second embodiment is not bent.

FIG. 6 is a cross sectional view illustrating an example of the circuit module according to the second embodiment, and illustrates a cross section corresponding to FIG. 2. FIG. 7 is a plan view illustrating a state where the circuit board according to the second embodiment is not bent. As illustrated in FIG. 6 and FIG. 7, a circuit module 1B differs from the circuit module 1 illustrated in FIG. 1 through FIG. 3 in that the circuit board 10 is replaced by the circuit board 10B, and the board 20 provided with electrodes is replaced by a board 20B provided with electrodes.

The circuit board 10B includes a wiring board 110B, the electronic components 120, the bonding layers 131 and 132, the magnetic shielding member 140, and magnets 151 through 153. However, the circuit board 10B may be configured to include no magnets 151 through 153, and attachable with the magnets 151 through 153 when required.

As illustrated in FIG. 7, the first surface 110a of wiring board 110B includes a circuit area 111B and a terminal area 112B. The circuit area 111B is provided on one side of the first surface 110a along the longitudinal direction of the first surface in a state before the wiring board 110B is bent. The plurality of electronic components 120 is mounted in the circuit area 111B. The second surface 110b of the wiring board 110B is not mounted with an electronic component or the like, and the second surface 110b has no interconnects and no electrodes formed thereon. In addition, the terminal area 112B is provided adjacent to the circuit area 111B on the other side of the first surface 110a along the longitudinal direction of the first surface. Connection terminals 116, 117, and 118 are disposed in the terminal area 112B.

As illustrated in FIG. 6, the circuit area 111B of the wiring board 110B is disposed above the first principal surface 140a of the magnetic shielding member 140, and the terminal area 112B is disposed below the second principal surface 140b of the magnetic shielding member 140. As described above, the circuit area 111B and the terminal area 112B are disposed on opposite sides of the magnetic shielding member 140 in the cross sectional view.

The magnet 153 may be bonded to the connection terminal 118 by a solder or the like, for example. The metal layer 155 is preferably formed on a surface of the magnet 153, in order to improve a connection reliability (or interface reliability) between the terminal 118 and the magnet 153, and to reduce electrical resistances. A material used for the magnet 153 may be similar to the material used for the magnets 151 and 152.

The board 20B provided with electrodes includes a wiring board 210B, and ferromagnetic metal portions 251 through 253. In a first surface 210a of the wiring board 210B, a pad (not illustrated) is formed in an area overlapping the connection terminal 118 in the plan view, and the ferromagnetic metal portion 253 is bonded to the pad (not illustrated) by a solder or the like, for example. The ferromagnetic metal portion 253 forms a protruding electrode, and is detachably connectable to the magnet 153 by a magnetic force of the magnet 153, and the ferromagnetic metal portion 254 is electrically connected to the magnet 153. A material used for the ferromagnetic metal portion 253 may be similar to the material used for the ferromagnetic metal portions 251 and 252. The metal layer 255 is preferably formed on a surface of the ferromagnetic metal portion 253.

A magnets may be used in place of the ferromagnetic metal portion 253, as the protruding electrode. However, because the magnet has polarities, it becomes necessary to match the polarities of the magnet so that the magnet is detachably connectable by magnetic attraction to the magnet 153. For this reason, it is easier to manufacture the board 20B provided with electrodes using the non-polar ferromagnetic metal portion 253 as protruding electrode.

External electrodes 216 through 218 are provided on the second surface 210b of the wiring board 210B, along the longitudinal direction of wiring board 210, for example. The external electrode 218 is electrically connected to a pad to which the ferromagnetic metal portion 253 is fixed, via an interconnect, a through hole, or the like (not illustrated). The external electrodes 216 through 218 are portions that make contact with the measurement target, and to which signals from the measurement target are input. A material used for the external electrode 218 may be similar to the material used for the external electrodes 216 and 217. The signal input from the external electrode 218 is input to the required portion of the electronic component 120 via the ferromagnetic metal portion 253, the magnet 153, and the connection terminal 118. One of the external electrodes 216 through 218 can be used as a reference electrode.

Accordingly, in a state before wiring board 110B is bent, one terminal area 112B where the connection terminals 116 through 118 are disposed may be provided on one side of the circuit area 111B of the first surface 110*a*. Similar to the case of the wiring board 110A, the wiring board 110B has a bent shape such that the wiring board 110B is bent along the magnetic shielding member 140 in an area between the circuit area 111B and the terminal area 112B. Thus, the circuit area 111B is disposed above the first principal surface 140*a* of magnetic shielding member 140, and the terminal area 112B is disposed below the second principal surface 140*b* of the magnetic shielding member 140. As a result, it is possible to obtain effects that are the same as the effects obtainable in the first embodiment.

In addition, when the circuit module 1B is used as a myoelectric sensor, for example, the reference electrode assumes a reference potential of a myoelectric signal. For this reason, in the circuit module 1B, by using one of the external electrodes 216 through 218 electrically connected to the connection terminals 116 through 118, respectively, as the reference electrode, it becomes possible to detect a more stable myoelectric signal.

First Modification of Second Embodiment

A first modification of the second embodiment relates to another example of the circuit module having three or more external electrodes. In the first modification of the second embodiment, those constituent elements that are the same as the constituent elements of the first embodiment are designated by the same reference numerals, and a repeated description thereof may be omitted.

Figure 8:
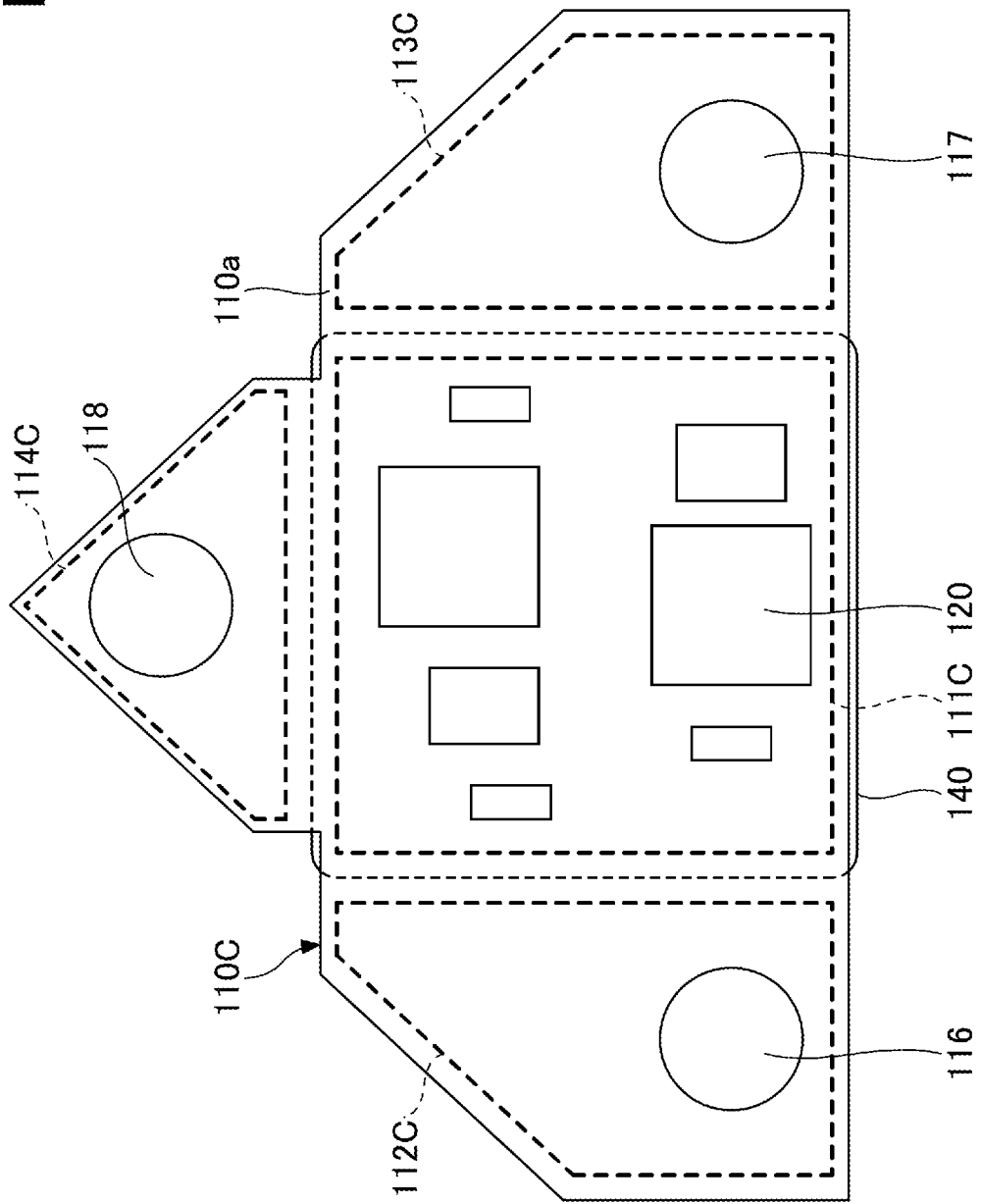
FIG. 8 is a plan view illustrating an example of the state where the wiring board according to a first modification of the second embodiment is not bent.
Figure 9:
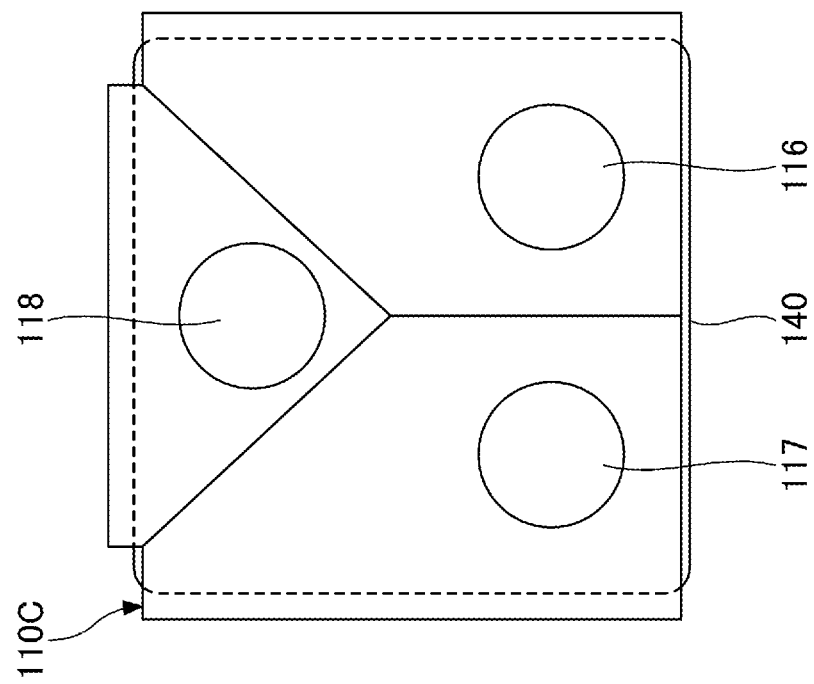
FIG. 9 is a bottom view illustrating an example of a state where the wiring board according to the first modification of the second embodiment is bent.

FIG. 8 is a plan view illustrating a state where the circuit board according to the first modification of the second embodiment is not bent. FIG. 9 is a bottom view illustrating a state where the circuit board according to the first modification of the second embodiment is bent.

As illustrated in FIG. 8 and FIG. 9, a circuit area 111C includes four sides in the plan view in the state before a wiring board 110C is bent. Terminal areas 112C, 113C, and 114C extend outward from three sides of the circuit area 111C on the first surface 110*a* of the wiring board 110C. The connection terminals 116, 117, and 118 are provided in the terminal areas 112C, 113C, and 114C, respectively.

The wiring board 110C has a bent shape such that the wiring board 110C is bent along the magnetic shielding member 140 in areas between the circuit area 111C and each of the terminal areas 112C, 113C, and 114C. Hence, in a cross sectional view (not illustrated) of a circuit module including the wiring board 110C having the bent shape, the circuit area 111C is disposed above the first principal surface 140*a* of the magnetic shielding member 140, and the terminal areas 112C, 113C, and 114C are disposed below the second principal surface 140*b* of the magnetic shielding member 140. As a result, it is possible to obtain effects that are the same as the effects obtainable in the first embodiment. The terminal areas 112C, 113C, and 114C may have appropriate shapes so as not to overlap one another below the second principal surface 140*b* of the magnetic shielding member 140 when the wiring board 110C is bent (or folded).

In addition, when the circuit module according to the first modification of the second embodiment is used as the myoelectric sensor, for example, the reference electrode assumes the reference potential of the myoelectric signal. For this reason, in the circuit module according to the first modification of the second embodiment, by using one of the external electrodes electrically connected to the connection terminals 116 through 118, respectively, as the reference electrode, it becomes possible to detect a more stable myoelectric signal.

Second Modification of Second Embodiment

A second modification of the second embodiment relates to another example of the circuit module having three or more external electrodes. In the second modification of the second embodiment, those constituent elements that are the same as the constituent elements of the first embodiment are designated by the same reference numerals, and a repeated description thereof may be omitted.

Figure 10:
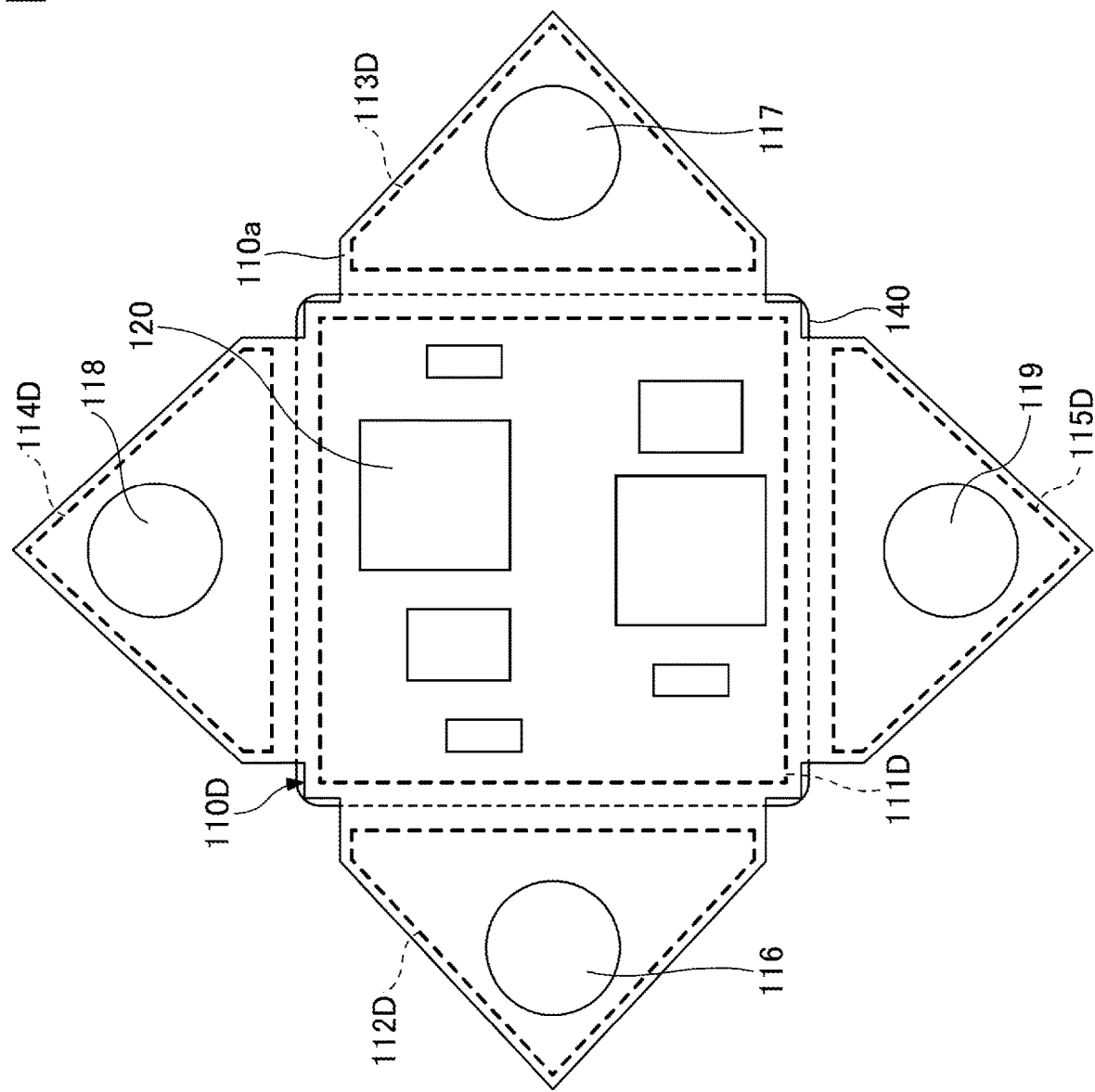
FIG. 10 is a plan view illustrating an example of the state where the wiring board according to a second modification of the second embodiment is not bent.

FIG. 10 is a plan view illustrating a state where the circuit board according to a second modification of the second embodiment is not bent. FIG. 11 is a bottom view illustrating a state where the circuit board according to the second modification of the second embodiment is bent.

As illustrated in FIG. 10 and FIG. 11, a circuit area 111D includes four sides in the plan view in the state before a wiring board 110D is bent. Terminal areas 112D, 113D, 114D, and 115D extend outward the four sides of the circuit area 111D on the first surface 110*a* of wiring board 110D. Connection terminals 116, 117, 118, and 119 are provided in the terminal areas 112D, 113D, 114D, and 115D, respectively.

The wiring board 110D has a bent shape such that the wiring board 110D is bent along the magnetic shielding member 140 in areas between the circuit area 111D and each of the terminal areas 112D, 113D, 114D, and 115D. Hence, in a cross sectional view (not illustrated) of the circuit module including the wiring board 110D having the bent shape, the circuit area 111D is disposed above the first principal surface 140*a* of the magnetic shielding member 140, and the terminal areas 112D, 113D, 114D, and 115D are disposed below the second principal surface 140*b* of the magnetic shielding member 140. As a result, it is possible to obtain effects that are the same as the effects obtainable in the first embodiment. The terminal areas 112D, 113D, 114D, and 115D may have appropriate shapes so as not to overlap one another below the second principal surface 140*b* of the magnetic shielding member 140 when the wiring board 110D is bent (or folded).

In addition, when the circuit module according to the second modification of the second embodiment is used as the myoelectric sensor, for example, the reference electrode assumes the reference potential of the myoelectric signal. For this reason, in the circuit module according to the second modification of the second embodiment, by using one of the external electrodes electrically connected to the connection terminals 116 through 119, respectively, as the reference electrode, it becomes possible to detect a more stable myoelectric signal.

Accordingly to each of the embodiments modifications described above, it is possible to provide a circuit board with an improved degree of freedom of layout design without forming an interlayer connection structure on the magnetic shielding member.

Although the embodiments and modifications are respectively numbered with, for example, "first," or "second," the ordinal numbers do not imply priorities of the embodiments and modifications. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A circuit board comprising:
a magnetic shielding member having a first principal surface, and a second principal surface on an opposite side from the first principal surface; and
a flexible wiring board having a first surface, and a second surface on an opposite side from the first surface, wherein
the second surface of the flexible wiring board is fixed to the first principal surface and the second principal surface of the magnetic shielding member,
the first surface of the flexible wiring board includes a circuit area mounted with an electronic component, and one or more terminal areas where connection terminals are disposed,
the circuit area is disposed above the first principal surface of the magnetic shielding member, and
the flexible wiring board has a bent shape bent along the magnetic shielding member, so that the one or more terminal areas are disposed below the second principal surface of the magnetic shielding member.

2. The circuit board as claimed in claim 1, wherein each of the connection terminals is bonded to a magnet having a metal layer formed thereon.

3. The circuit board as claimed in claim 1, wherein the second surface of the flexible wiring board, overlapping the connection terminals in a plan view, and the magnetic shielding member are bonded via an bonding layer.

4. The circuit board as claimed in claim 1, wherein
one terminal area in which the connection terminals are disposed is provided on one side of the circuit area on the first surface in a development view corresponding to a state before the flexible wiring board is bent, and
in the bent shape of the flexible wiring board, the flexible wiring board is bent along the magnetic shielding member in an area between the circuit area and the one terminal area, and the one terminal area is disposed below the second principal surface of the magnetic shielding member.

5. The circuit board as claimed in claim 1, wherein
a plurality of terminal areas in which the connection terminals are disposed is provided on one side of the circuit area on the first surface in a development view corresponding to a state before the flexible wiring board is bent, and
in the bent shape of the flexible wiring board, the flexible wiring board is bent along the magnetic shielding member in areas between the circuit area and each terminal area of the plurality of terminal areas, and each terminal area of the plurality of terminal areas is disposed below the second principal surface of the magnetic shielding member.

6. The circuit board as claimed in claim 5, wherein
the circuit area has four sides in a plan view, and
three terminal areas extend outward from three of the four sides of the circuit area on the first surface in the development view corresponding to the state before the flexible wiring board is bent.

7. The circuit board as claimed in claim 5, wherein
the circuit area has four sides in a plan view, and
four terminal areas extend outward from the four sides of the circuit area on the first surface in the development view corresponding to the state before the flexible wiring board is bent.

8. A circuit module comprising:
the circuit board as claimed in claim 2; and
a board having a third surface provided with a protruding electrode, and a fourth surface on an opposite side from the third surface provided with an external electrode electrically connected to the protruding electrode,
wherein the magnet and the protruding electrode are detachably connected to each other.

9. The circuit module as claimed in claim 8, wherein the protruding electrode includes a ferromagnetic metal portion.

10. The circuit module as claimed in claim 8, wherein the board is flexible or stretchable.

* * * * *